United States Patent
Fukuoka et al.

[11] Patent Number: 5,645,753
[45] Date of Patent: Jul. 8, 1997

[54] PIEZO-ELECTRIC CERAMIC COMPOSITION

[75] Inventors: Shuichi Fukuoka; Kousei Kamigaki; Kazutaka Uchi; Katsuhiko Onitsuka, all of Kokubu, Japan

[73] Assignee: Kyocera Corporation, Kyoto, Japan

[21] Appl. No.: 445,151

[22] Filed: May 19, 1995

[30] Foreign Application Priority Data

| May 19, 1994 | [JP] | Japan | 6-105334 |
| Dec. 14, 1994 | [JP] | Japan | 6-310278 |

[51] Int. Cl.$^6$ ............................................. C04B 35/49
[52] U.S. Cl. ........................... 252/62.9 PZ; 501/138; 501/136; 501/134
[58] Field of Search ........................... 501/139, 136, 501/134; 252/62.9 PZ

[56] References Cited

FOREIGN PATENT DOCUMENTS

| 49-27897 | 3/1974 | Japan . |
| 56-48005 | 5/1981 | Japan . |
| 2-303078 | 12/1990 | Japan . |
| 2-303080 | 12/1990 | Japan . |
| 7-45124 | 2/1995 | Japan . |
| 7-187776 | 7/1995 | Japan . |

*Primary Examiner*—Melissa Bonner
*Attorney, Agent, or Firm*—Loeb & Loeb LLP

[57] ABSTRACT

A piezo-electric ceramic composition which is favorably used for such applications as ceramic filter, vibrator applying ultrasonic waves, piezo-electric buzzer, piezo-electric ignition unit, ultrasonic wave motor, piezo-electric fan and piezo-electric sensors such as acceleration sensor, knocking sensor, AE sensor, etc. and is particularly used as a member for constituting a piezo-electric actuator. The piezo-electric ceramic composition is a composite perovskite compound which contains, as metal components, Pb, Zr, Ti, Zn, Sb as well as Sr and Ba, or Pb, Zr, Ti, Zn, Sb and at least either one or Sr or Ba, and Ni and Te, wherein when the composition by the molar ratio of metal elements is expressed by the following general formula (1),

$$Pb_{1-x-y}Sr_xBa_y(Zn_{1/3}Sb_{2/3})_aZr_b(Ni_{1/2}Te_{1/2})_cTi_{1-a-b-c}O_3 \quad (1)$$

x, y, a, b and c satisfy the following relationships,

$0 \leq x \leq 0.14$
$0 \leq y \leq 0.14$
$0 < x + y$
$0.01 \leq a \leq 0.12$
$0.43 \leq b \leq 0.58$
$0 \leq c \leq 0.02$.

8 Claims, 5 Drawing Sheets

PIEZO-ELECTRIC CERAMIC COMPOSITION

BACKGROUND OF THE INVENTION

1. Field of the Invention

The present invention relates to a piezo-electric ceramic composition. More specifically, the invention relates to a piezo-electric ceramic composition which is favorably used for such applications as ceramic filter, vibrator applying ultrasonic waves, piezo-electric buzzer, piezo-electric ignition unit, ultrasonic wave motor, piezo-electric fan and piezo-electric sensors such as acceleration sensor, knocking sensor, AE sensor, etc. and is particularly used as a member for constituting a piezo-electric actuator such as an actuator for ink-jet printer set.

2. Description of the Prior Art

Products which are made of piezo-electric ceramic compositions and have heretofore been put into practical use include ceramic filters, vibrators applying ultrasonic waves, piezo-electric buzzers, piezo-electric ignition units, ultrasonic wave motors, piezo-electric fans, piezo-electric sensors, piezo-electric actuators, etc.

Here, the piezo-electric actuator utilizes the displacement or force generated by the piezo-electric phenomenon as a mechanical source of drive and is recently drawing attention in the field of mechatronics. The piezo-electric actuator is a solid element which utilizes the piezo-electric effect and has such excellent features as reduced power consumption, quick response speed, large amount of displacement, generation of heat in reduced amounts, and decrease in the size and weight as compared with those of the conventional electromagnetic actuator which is constituted by winding a coil on a magnetic material. Because of these advantages, the piezo-electric actuators have been studied and developed extensively accompanying the progress in the mechatronics.

As the actuators are finding extensive applications, however, it has now been urged to produce ever large mechanical displacement and to provide the actuators that can be used over a wide range of temperatures (−30° to 150° C.). That is, it is desired that the actuators have a high Curie temperature. Generally, furthermore, it is desired that the actuator element has a piezo-electric strain constant and, particularly, a constant $d_{33}$ which is as large as possible. Thus, properties of the piezo-electric material which is adapted to be used as a piezo-electric actuator can be evaluated depending upon the constants that are usually used for the materials of this kind (e.g., electro-mechanical coupling constant, dielectric constant, piezo-electric strain constant, etc.) and Curie temperature.

As a piezo-electric ceramic composition that meets the above-mentioned object, there can be exemplified a PbZrTiO$_3$ (hereinafter often referred to simply as PZT) for which Pb(Ni$_{1/3}$Nb$_{2/3}$)O$_3$ is substituted as a third component, such as Pb(Ni$_{1/3}$Nb$_{2/3}$)$_{0.5}$Zr$_{0.15}$Ti$_{0.35}$O$_3$.

The characteristics of this sample are shown in Table 2 in the Example to be shown in the following Examples (samples No. 1 to 32), Table 3 (samples No. 2 to 19), and Table 5 (samples No. 3 to 23). This composition has favorable properties such as piezo-electric strain constant (constant $d_{33}$) which is larger than 600×10$^{-12}$ m/V.

When the above-mentioned PZT for which Pb(Ni$_{1/3}$Nb$_{2/3}$)O$_3$ is substituted as the third component is used as the piezo-electric actuator, however, the Curie temperature (Tc) is so low that it cannot be used in an environment where it is exposed to temperatures of as high as 100° to 150° C.

As mentioned above, the PZT system which has a large piezo-electric strain constant also has a low Curie temperature and low heat durability, and finds only a very narrow range of applications when it is used as a displacement element.

Moreover, the actuator is always receiving compressive stress. Therefore, what becomes a problem is a reduction in the piezo-electric strain constant, i.e., road durability. In the case of the above-mentioned composition, however, the piezo-electric strain constant decreases to a great degree and the road durability is poor. That is, when a load of 1 ton/cm$^2$ is repetitively applied 10 times, the constant $d_{33}$ is attenuated by not smaller than 40%, from which the PZT system is not suited for the applications where large stress is exerted as will be obvious from curves of FIGS. 1, 2 and 5 that represent relationships between the retentivity of piezo-electric strain constant and the number of times of repetitively applying the load on the samples of Comparative Examples.

Moreover, an increase in the attenuation of the piezo-electric strain constant under the compressive stress means that the state of the ferroelectric domain structure is subject to change, which could become a cause of an increase in the displacement hysteresis.

For instance, the resolution is deteriorated since the displacement hysteresis exceeds 10% when, for example, 100 V/mm is applied. Therefore, the PZT system is not suited for being used as a positioning device.

Moreover, the displacement that occurs upon the application of voltage changes depending upon the temperature (ratio of the displacement in the polarization direction of when a voltage 100 V/mm is applied to a sample at 20° C. to the displacement at 120° C.) at a rate which is larger than 15%, and the positioning precision decreases accompanying a change in the temperature.

SUMMARY OF THE INVENTION

The object of the present invention therefore is to provide a piezo-electric ceramic composition which is excellent in piezo-electric strain property, Curie temperature, road durability, heat durability, displacement hysteresis and displacement upon the application of voltage that little changes depending upon the temperature, and is suited for use as piezo-electric actuators and piezo-electric sensors.

The present inventors have conducted the study in an attempt to find an optimum third component that solid-dissolves in the PbZrO$_3$-PbTiO$_3$, discovered the fact that a piezo-electric ceramic composition which is excellent in piezo-electric strain property, Curie temperature and road durability can be obtained by solid-dissolving a composition Pb(Zn$_{1/3}$Sb$_{2/3}$)O$_3$ as the third component, and have accomplished the present invention.

Moreover, the inventors have discovered the fact that displacement hysteresis characteristics can be greatly improved in addition to the above-mentioned piezo-electric strain property, Curie temperature and road durability when Pb(Ni$_{1/2}$Te$_{1/2}$)O$_3$ is solid-dissolved in addition to PbZrO$_3$-PbTiO$_3$ and Pb(Zn$_{1/3}$Sb$_{2/3}$)O$_3$, and have further discovered that distinguished improvements can be accomplished in regard to heat durability and displacement that changes little depending upon the temperature when PbO and Nb$_2$O$_3$ are added in suitable amounts.

According to the present invention, there is provided a piezo-electric ceramic composition of a composite perovskite compound which contains, as metal components, Pb, Zr, Ti, Zn, Sb and at least one selected from Sr and Ba, or Pb, Zr, Ti, Zn, Sb and at least one selected from Sr and Ba, and Ni and Te, wherein when the composition by the molar ratio of metal elements is expressed by the following general formula (1), (1)

x, y, a, b and c satisfy the following relationships, $0 \leq x \leq 0.14$ $0 \leq y \leq 0.14$ $0 < x+y$ $0.01 \leq a \leq 0.12$ $0.43 \leq b \leq 0.58$ $0 \leq c \leq 0.02$.

According to an aspect of the piezo-electric ceramic composition of the present invention, there is further provided a piezo-electric ceramic composition having excellent piezo-electric strain property, Curie temperature and road durability, which is a composite perovskite compound containing, as metal components, Pb, Zr, Ti, Zn, Sb, and at least one selected from Sr and Ba, wherein when the composition by the molar ratio of metal elements is expressed as $Pb_{1-x-y}Sr_xBa_y(Zn_{1/3}Sb_{2/3})_aZr_bTi_{1-a-b}O_3$, x, y, a and b satisfy the following relationships, $0 \leq x \leq 0.14$ $0 \leq y \leq 0.14$ $0 < x+y$ $0.01 \leq a \leq 0.12$ $0.43 \leq b \leq 0.58$.

According to a second aspect of the piezo-electric ceramic composition of the present invention, there is further provided a piezo-electric ceramic composition having excellent piezo-electric strain property, Curie temperature, road durability and particularly excellent displacement hysteresis characteristics, which is a composite perovskite compound containing, as metal components, Pb, Zr, Ti, Zn, Sb, Ni, Te, and at least one selected from Sr and Ba, wherein when the composition by the molar ratio of metal elements is expressed as $Pb_{1-x-y}Sr_xBa_y(Zn_{1/3}Sb_{2/3})_aZr_b(Ni_{1/2}Te_{1/2})_cTi_{1-a-b-c}O_3$, x, y, a, b and c satisfy the following relationships, $0 \leq x \leq 0.14$ $0 \leq y \leq 0.14$ $0 < x+y$ $0.01 \leq a \leq 0.12$ $0.43 \leq b \leq 0.58$ $0.002 \leq c \leq 0.020$.

According to a third aspect of the present invention, furthermore, there is provided a piezo-electric ceramic composition which is a composite perovskite compound containing, as metal components, Pb, Zr, Ti, Zn, Sb, Ni, Te, and at least one selected from Sr and Ba, wherein when the composition by the molar ratio of metal elements is expressed as $Pb_{1-x-y}Sr_xBa_y(Zn_{1/3}Sb_{2/3})_aZr_b(Ni_{1/2}Te_{1/2})_cTi_{1-a-b-c}O_3$, x, y, a, b and c satisfy the following relationships, $0 \leq x \leq 0.12$ $0 \leq y \leq 0.12$ $0 < x+y$ $0.05 \leq a \leq 0.12$ $0.43 \leq b \leq 0.52$ $0 \leq c \leq 0.015$ and wherein PbO and $Nb_2O_5$ of an equal molar ratio are added in a total amount of from 0.2 to 1.2 parts by weight per 100 parts by weight of the above-mentioned basic components.

This piezo-electric ceramic composition exhibits the above-mentioned excellent properties and particularly excellent heat durability and small change in the displacement caused by the temperature.

DETAILED DESCRIPTION OF THE PREFERRED EMBODIMENTS

The piezo-electric ceramic composition of the present invention is a composite perovskite compound represented by a particular composition formula in which at least a composition $Pb(Zn_{1/3}Sb_{2/3})O_3$ is contained being solid-dissolved in $PbZrO_3$-$PbTiO_3$ and in which are further contained at least one metal element selected from Sr and Ba, or in which are further contained either one of Sr or Ba or both as well as Ni and Te. The piezo-electric ceramic composition exhibits superior piezo-electric strain property, Curie temperature and road durability to those of ceramics or ceramic compositions of conventional perovskite compounds, and is suited for use as an actuator material.

Among the ceramic compositions of the present invention, the one according to the first aspect is a composite perovskite compound containing, as metal components, at least Pb, Zr, Ti, Zn, Sb, and at least one selected from Sr and Ba, wherein when the composition by the molar ratio of metal elements is expressed as $Pb_{1-x-y}Sr_xBa_y(Zn_{1/3}Sb_{2/3})_aZr_bTi_{1-a-b}O_3$, x, y, a and b satisfy the following relationships, $0 \leq x \leq 0.14$ $0 \leq y \leq 0.14$ $0 < x+y$ $0.01 \leq a \leq 0.12$ $0.43 \leq b \leq 0.58$.

Described below are the reasons why x, y, a and b in the ceramic composition of this aspect are limited to the above-mentioned ranges.

Substitution with Sr is effective in obtaining a very large piezo-electric strain constant $d_{33}$, and the amount of substitution is specified to be $0 \leq x \leq 0.14$. This is because, when x is larger than 0.14, the Curie temperature drops abruptly to become well under 150° C. Substitution with Ba makes it possible to increase the Curie temperature to be not lower than 200° C. and to increase the piezo-electric strain constant $d_{33}$ to be not smaller than $600 \times 10^{-12}$ m/v, which is quite effective in obtaining a very high Curie temperature and a large piezo-electric strain constant $d_{33}$. Here, however, the amount of substitution y is specified to be $0 \leq y \leq 0.14$ because of the reason that when y is larger than 0.14, the Curie temperature greatly drops to become lower than 150° C.

The amount a of substituting Ti with $(Zn_{1/3}Sb_{2/3})$ is specified to be $0.01 \leq a \leq 0.12$. This is because, a large amount a makes it possible to obtain a large piezo-electric strain constant which is desirable for the piezo-electric actuator. When the amount a of substitution is small, on the other hand, there is obtained a large piezo-electric output constant $g_{33}$ which is desirable for a piezo-electric sensor such as an acceleration sensor. When, the amount a of substitution is smaller than 0.01, however, the piezo-electric strain constant $d_{33}$ cannot be increased to be larger than $400 \times 10^{-12}$ m/v. Besides, change in the piezo-electric output constant $g_{33}$ increases with aging or depending upon the temperature, so that the piezo-electric sensor loses practicability. When the amount a of substitution is larger than 0.12, on the other hand, the Curie temperature decreases greatly and dielectric loss becomes very large, too. When the piezo-electric ceramic composition of the present invention is used as a piezo-electric actuator, the amount a of substitution is selected to be $0.05 \leq a \leq 0.12$ in order to obtain a large piezo-electric strain constant. When the piezo-electric ceramic composition of the invention is used as a piezo-electric sensor, on the other hand, the amount a of substitution is selected to be $0.01 \leq a \leq 0.05$ in order to obtain a large piezo-electric output constant $g_{33}$.

When the ratio of solid solution of $PbZrO_3$ and $PbTiO_3$ is changed in the piezo-electric ceramic composition which contains PZT as a chief component, there exists an MPB (molphotropic phase boundary) that exhibits a maximum piezo-electric strain constant. As the piezo-electric actuator material, there can be used composition values of the MPB and the vicinities thereof. The MPB changes depending upon the amounts x and a. Therefore, the value b must be within such a composition range in which the MPB is trapped in the composition ranges of x and a. That is, the value b is selected to be $0.43 \leq b \leq 0.58$ because of the reason that the MPB is not trapped outside this range.

To obtain the piezo-electric ceramic of the present invention, powders of, for example, PbO, $ZrO_2$, $TiO_2$, $SrCO_3$, $BaCO_3$, ZnO and $Sb_2O_3$ are weighed and mixed as starting materials. The mixture is then dehydrated and dried, and is then calcined at 850° to 900° C. for 1 to 3 hours. The calcined product is pulverized again using a ball mill or the like.

The pulverized product is then blended with an organic binder (PVA) and is granulated. The obtained powder is molded under the application of a predetermined pressure, and the molded article is fired at 1240° to 1300° C. for 1 to 3 hours to obtain the piezo-electric ceramic of the present invention.

In the piezo-electric ceramic composition of this aspect, Pb is partly substituted with Sr and Ba, and a composition $Pb(Zn_{1/3}Sb_{2/3})O_3$ is solid-dissolved as a third component in $PbZrO_3$-$PbTiO_3$ to obtain high piezo-electric strain property and high Curie temperature. Unlike the conventional ceramic composition of this kind, furthermore, $Pb(Ni_{1/3}Nb_{2/3})O_3$ is not used. Therefore, even after a predetermined load is repetitively exerted, the piezo-electric strain constant is not attenuated and enhanced road durability is obtained.

Among the ceramic compositions of the present invention, the ceramic composition of the second aspect is a composite perovskite compound containing, as metal components, Pb, Zr, Ti, Zn, Sb, Ni, Te, and at least one selected from Sr and Ba, wherein when the composition by the molar ratio of metal elements is expressed as $Pb_{1-x-y}Sr_xBa_y(Zn_{1/3}Sb_{2/3})_aZr_b(Ni_{1/2}Te_{1/2})_cTi_{1-a-b-c}O_3$, x, y, a, b and c satisfy the following relationships, $0 \leq x \leq 0.14$ $0 \leq y \leq 0.14$ $0 < x+y$ $0.01 \leq a \leq 0.12$ $0.43 \leq b \leq 0.58$ $0.002 \leq c \leq 0.020$.

Described below are the reasons why x, y, a, b and c are limited to the above-mentioned ranges.

Substitution with Sr is effective in obtaining a very large piezo-electric strain constant $d_{33}$, and the amount of substitution is specified to be $0 \leq x \leq 0.14$. This is because, when x is larger than 0.14, the Curie temperature drops abruptly to become well under 150° C. It is desired that the amount x of substitution with Sr is $0.04 \leq x \leq 0.12$.

Substitution with Ba makes it possible to increase the Curie temperature to be not lower than 200° C. and to increase the piezo-electric strain constant $d_{33}$ to be not smaller than $600 \times 10^{-12}$ m/v, which is quite effective in obtaining a very high Curie temperature and a large piezo-electric strain constant $d_{33}$. Here, however, the amount of substitution y is specified to be $0 \leq y \leq 0.14$ because of the reason that when y is larger than 0.14, the Curie temperature greatly drops to become lower than 150° C. It is desired that the amount y of substitution with Ba is $0.02 \leq y \leq 0.12$.

The amount a of substituting Ti with $(Zn_{1/3}Sb_{2/3})$ is specified to be $0.01 \leq a \leq 0.12$. This is because, a large amount a makes it possible to obtain a large piezo-electric strain constant which is desirable for the piezo-electric actuator. When the amount a of substitution is small, on the other hand, there is obtained a large piezo-electric output constant $g_{33}$ which is desirable for a piezo-electric sensor such as an acceleration sensor. When, the amount a of substitution is smaller than 0.01, however, the piezo-electric strain constant $d_{33}$ cannot be increased to be not smaller than $400 \times 10^{-12}$ m/v. Besides, a change in the piezo-electric output constant $g_{33}$ increases with aging or depending upon the temperature, so that the piezo-electric sensor loses practicability. When the amount a of substitution is larger than 0.12, on the other hand, the Curie temperature decreases greatly and dielectric loss becomes very large, too. It is desired that the amount a of substituting Ti with $(Zn_{1/3}Sb_{2/3})$ is specified to be $0.05 \leq a \leq 0.10$. When the piezo-electric ceramic composition of this embodiment is used as a piezo-electric actuator, the amount a of substitution is selected to be $0.05 \leq a \leq 0.12$ in order to obtain a large piezo-electric strain constant. When the piezo-electric ceramic composition is used as a piezo-electric sensor, on the other hand, the amount a of substitution is selected to be $0.01 \leq a \leq 0.05$ in order to obtain a large piezo-electric output constant $g_{33}$.

Furthermore, the amount of substituting Ti with $(Ni_{1/2}Te_{1/2})$ is selected to be $0.002 \leq c \leq 0.020$. This is because very excellent properties are exhibited in regard to road durability and displacement hysteresis when the amount c of substitution is large. When the amount c of substitution exceeds 0.020, however, the piezo-electric properties are greatly deteriorated by the aging at 130° C. making it difficult to obtain a piezo-electric strain constant $d_{33}$ which is not smaller than $400 \times 10^{-12}$ m/V. When the amount c of substitution is smaller than 0.002, road durability and displacement hysteresis are not almost improved. It is desired that the amount of substituting Ti with $(Ni_{1/2}Te_{1/2})$ is $0.002 \leq c \leq 0.007$.

When the ratio of solid solution of $PbZrO_3$ and $PbTiO_3$ is changed in the piezoelectric ceramic composition which contains PZT as a chief component, there exists an MPB (molphotropic phase boundary) that exhibits a maximum piezo-electric strain constant. As the piezo-electric actuator material, there can be used composition values of the MPB and the vicinities thereof. The MPB changes depending upon the amounts x, a and c. Therefore, the value b must be within such a composition range in which the MPB is trapped in the composition ranges of x, a and c. That is, the value b is selected to be $0.43 \leq b \leq 0.58$ because of the reason that the MPB is not trapped outside this range.

To obtain this piezo-electric ceramic of the present invention, powders of, for example, PbO, $ZrO_2$, $TiO_2$, $SrCO_3$, $BaCO_3$, ZnO, $Sb_2O_3$, NiO and $TeO_2$ are weighed and mixed as starting materials. The mixture is then dehydrated and dried, and is then calcined at 850° to 900° C. for 1 to 3 hours. The calcined product is pulverized again using a ball mill or the like.

The pulverized product is then blended with an organic binder (PVA) and is granulated. The obtained powder is molded under the application of a predetermined pressure, and the molded article is fired in a lead atmosphere at 1240° to 1300° C. for 1 to 3 hours to obtain the piezo-electric ceramic of the present invention.

In the piezo-electric ceramic composition of this aspect, Pb is partly substituted with Sr and/or Ba, and compositions $Pb(Zn_{1/3}Sb_{2/3})O_3$ and $Pb(Ni_{1/2}Te_{1/2})O_3$ are solid-dissolved as a third component and a fourth component in $PbZrO_3$-$PbTiO_3$ to obtain high piezo-electric strain property, small displacement hysteresis and high Curie temperature. Unlike the conventional ceramic composition of this kind, furthermore, $Pb(Ni_{1/3}Nb_{2/3})O_3$ is not used as the third component. Therefore, even after a predetermined load is repetitively exerted, the piezo-electric strain constant is not attenuated, road durability is improved, and displacement hysteresis is decreased.

Next, the ceramic composition according to the third aspect of the present invention is a composite perovskite compound containing, as metal components, Pb, Zr, Ti, Zn, Sb, Ni, Te, and at least one selected from Sr and Ba, wherein when the composition by the molar ratio of metal elements is expressed as $Pb_{1-x-y}Sr_xBa_y(Zn_{1/3}Sb_{2/3})_aZr_b(Ni_{1/2}Te_{1/2})_cTi_{1-a-b-c}O_3$, x, y, a, b and c satisfy the following relationships, $0 \leq x \leq 0.12$ $0 \leq y \leq 0.12$ $0 < x+y$ $0.05 \leq a \leq 0.12$ $0.43 \leq b \leq 0.52$ $0 \leq c \leq 0.015$ and wherein PbO and $Nb_2O_5$ of an equal molar ratio are added in a total amount of from 0.2 to 1.2 parts by weight per 100 parts by weight of the above-mentioned basic components.

Described below are the reasons of setting the ranges of x, y, a, b and c.

Substituting Sr for Pb is very effective in obtaining a large piezo-electric strain constant $d_{33}$. Here, the amount x of substitution is selected to be $0 \leq x \leq 0.12$. This is because, when the amount of x is larger than 0.12, the Curie temperature greatly drops to become well under 170° C. resulting in a decrease in the heat durability. It is desired that the amount x of substitution with Sr is $0.04 \leq x \leq 0.10$.

Moreover, substituting Ba for Pb is effective in increasing the Curie temperature to be not lower than 200° C. and in increasing the piezo-electric strain constant $d_{33}$ to be not smaller than $600 \times 10^{-12}$ m/v, i.e., effective in obtaining a very high Curie temperature and a large piezo-electric strain constant $d_{33}$. Here, the amount y of substitution is selected to be $0 \leq y \leq 0.12$. This is because, when y is larger than 0.12, the Curie temperature greatly drops to become well under 170° C. resulting in a decrease in the heat durability. It is desired that the amount y of substitution with Ba is $0.02 \leq y \leq 0.12$.

The amount a of substituting $(Zn_{1/3}Sb_{2/3})$ for Ti is selected to be $0.05 \leq a \leq 0.12$. This is because, when a is large, an increased piezo-electric strain constant is obtained which is advantageous for the piezo-electric actuator. When a is small, on the other hand, there is obtained a large piezo-electric output constant $g_{33}$ which is advantageous for a piezo-electric sensor such as an acceleration sensor. When a is smaller than 0.05, however, the Curie temperature becomes not higher than 170° C. and the piezo-electric strain constant $d_{33}$ becomes not larger than $500 \times 10^{-12}$ m/v. When a is larger than 0.12, dielectric loss and elastic loss become very large, resulting in a considerable decrease in the road durability. It is desired that the amount a of substituting $(Zn_{1/3}Sb_{2/3})$ for Ti is $0.07 \leq a \leq 0.10$.

Moreover, the amount c of substituting $(Ni_{1/2}Te_{1/2})$ for Ti is selected to be $0 \leq c \leq 0.015$. This is because, when c is large, very excellent properties are obtained in road durability and displacement hysteresis. When c is larger than 0.015, however, piezo-electric characteristics are deteriorated conspicuously due to aging (e.g., at 100° C.) and the heat durability decreases and, besides, the piezo-electric strain constant $d_{33}$ becomes smaller than $500 \times 10^{-12}$ m/v. It is desired that the amount c of substituting $(Ni_{1/2}Te_{1/2})$ for Ti is $0.002 \leq c \leq 0.007$.

When the ratio of solid solution of $PbZrO_3$ and $PbTiO_3$ is changed in the piezoelectric ceramic composition which contains PZT as a chief component, there exists an MPB (molphotropic phase boundary) that exhibits a maximum piezo-electric strain constant. As the piezo-electric actuator material, there can be used composition values of the MPB and the vicinities thereof. The MPB changes depending upon the amounts x, a and c. Therefore, the value b must be within such a composition range in which the MPB is trapped in the composition ranges of x, a and c. That is, the value b is selected to be $0.43 \leq b \leq 0.58$ because of the reason that the MPB is not trapped when b lies outside this range.

Furthermore, PbO and $Nb_2O_5$ of an equal molar ratio are added in a total amount of from 0.2 to 1.2 parts by weight per 100 parts by weight of the basic components represented by $Pb_{1-x-y}Sr_xBa_y(Zn_{1/3}Sb_{2/3})_aZr_b(Ni_{1/2}Te_{1/2})_cTi_{1-a-b-c}O_3$, in order to increase the piezo-electric strain constant $d_{33}$ without so much decreasing the Curie temperature and to improve heat durability and to increase the displacement of when a voltage is applied that varies depending upon the temperature. Here, PbO and $Nb_2O_5$ are added at an equal molar ratio and in a total amount of from 0.2 to 1.2 parts by weight. This is because, when the total amount is smaller than 0.2 parts by weight, the effect of addition is not almost obtained. When the total amount of addition is larger than 1.2 parts, on the other hand, the piezo-electric characteristics are conspicuously deteriorated through the aging at 130° C., which is not practicable. It is desired that PbO and $Nb_2O_5$ are added at an equal molar ratio in an amount of from 0.3 to 0.7 parts by weight. Here, PbO and $Nb_2O_5$ are added at an equal molar ratio in order that the elements (Pb, Sr, Ba, Zn, Sb, Ni, Te, Zr, Ti, Nb, O) constituting the perovskite structure are completely solid-dissolved.

In the ceramic composition of the embodiment of this invention, it is desired that the amounts of x, y, a, b, c and PbO and $Nb_2O_5$ are $0.04 \leq x \leq 0.10$, $0.02 \leq y \leq 0.12$, $0.07 \leq a \leq 0.10$, $0.43 \leq b \leq 0.52$, $0.002 \leq c \leq 0.007$, and that PbO and $Nb_2O_5$ are added at an equal molar ratio in a total amount of from 0.3 to 0.7 parts by weight.

To obtain the piezo-electric ceramic of the present invention, powders of, for example, PbO, $ZrO_2$, $TiO_2$, $SrCO_3$, $BaCO_3$, ZnO, $Sb_2O_3$, NiO, $TeO_2$ and $Nb_2O_5$ are weighed and mixed as starting materials. The mixture is then dehydrated and dried, and is then calcined at 850° to 900° C. for 1 to 3 hours. The calcined product is pulverized again using a ball mill or the like.

The pulverized product is then blended with an organic binder (PVA) and is granulated. The obtained powder is molded under the application of a predetermined pressure, and the molded article is fired in a lead atmosphere at 1240° to 1300° C. for 1 to 3 hours to obtain the piezo-electric ceramic of the present invention.

In a piezo-electric ceramic composition of the present invention in which PbO and $Nb_2O_5$ are added, Pb becomes Pb at a site A in the perovskite structure of the basic components and Nb is substituted for part of Ti at a site B of the basic components. Therefore, a piezo-electric ceramic composition in accordance with this embodiment may be expressed in a form in which PbO and $Nb_2O_5$ are added at an equal molar ratio to the basic components. The present invention, however, is in not limited to this embodiment. The present invention may encompass any production processing wherein Nb finally solid-dissolves in the site of the basic components.

Moreover, the piezo-electric ceramic composition of the present invention may contain pulverizing balls or elements that are infiltrated as impurities, or may contain other elements in small amounts.

In the piezo-electric ceramic composition of this embodiment, Pb is partly substituted with Sr and/or Ba, compositions $Pb(Zn_{1/3}Sb_{2/3})O_3$ and $Pb(Ni_{1/2}Te_{1/2})O_3$ are solid-dissolved as third and fourth components in $PbZrO_3$-$PbTiO_3$ and, besides, PbO and $Nb_2O_5$ are added at an equal molar ratio in an amount of from 0.2 to 1.2 parts by weight.

Therefore, there are obtained improved piezo-electric strain properties, small displacement hysteresis, high Curie temperature, and displacement upon the application of voltage that varies little with the temperature. Unlike the prior art, furthermore, $Pb(Ni_{1/3}Nb_{2/3})O_3$ is not used as the third component. Even when a predetermined load is repetitively exerted, therefore, attenuation of the piezo-electric strain constant is suppressed, and the piezo-electric ceramic composition exhibits improved road durability and decreased displacement hysteresis.

EXAMPLES

The invention will now be described more concretely by way of the following Examples.

EXAMPLE 1

Starting powders of PbO, $ZrO_2$, $TiO_2$, $SrCO_3$, $BaCO_3$, ZnO and $Sb_2O_3$ were weighed at ratios shown in Tables 1 and 2, and were wet-mixed using a ball mill for 24 hours. The mixture was then dehydrated and dried, and was then calcined at 870° C. for 3 hours. The calcined product was wet-pulverized again using the ball mill for 24 hours.

The pulverized product was then blended with an organic binder (PVA) and was granulated. By using the thus obtained powder, two kinds of molded articles were prepared under a pressure of 1.5 ton/cm², i.e., a disk having a diameter of 23 mm and a thickness of 3 mm and a cylinder having a diameter of 8 mm and a thickness of 18 mm. These articles were then fired under a condition of 1270° C. for 3 hours.

The obtained sintered products were polished and machined into a disk having a diameter of 20 mm and a thickness of 1 mm and a cylinder having a diameter of 6 mm and a thickness of 15 mm. Silver electrodes were attached by baking to their both surfaces, and polarization treatment was carried out in a silicone oil heated at 80° C. by applying a DC voltage of not lower than 1.5 KV/mm.

The disk and the cylinder subjected to the polarization treatment were aged at a constant temperature of 100° C. for one hour, and were left to stand for 24 hours. The thus obtained ceramics were examined for their piezo-electric constants (electro-mechanical coupling coefficient $K_{33}$, dielectric constant $\epsilon_{33}^T/\epsilon_0$, compliance constant $s_{33}^E$, piezo-electric strain constant $d_{33}$, mechanical quality coefficient Qm, dielectric loss tan $\delta_E$) in accordance with the measuring method standardized by the Japanese Association of Electronic Material Industries (EMAS). The Curie temperature Tc was that of when a maximum value in the dielectric constant was exhibited at the time when the phase was shifting from a normal dielectric phase on the high-temperature side into a ferro-electric phase on the low-temperature side. Road durability was found by repetitively applying a pressure of 1 ton/cm² onto the cylindrical ceramics at an interval of a cycle of 4 seconds by using a mono-axial hydraulic press machine and by measuring the retentivity of piezo-electric strain constant $d_{33}$. The ceramics that exhibited the attenuation factor of piezo-electric strain constant $d_{33}$ of not larger than 20% after the pressure was repetitively applied 10 times were regarded to be good ones, and the ceramics that exhibited the attenuation factor of larger than 20% were regarded to be bad ones. The results were as shown in Tables 1 and 2.

TABLE 1

| Sample No. | Composition | | | | Piezo-electric properties | | | | | | | | Durability |
|---|---|---|---|---|---|---|---|---|---|---|---|---|---|
| | x | y | a | b | $K_{33}$ (%) | $\epsilon_{33}^T / \epsilon_0$ | $S_{33}^E$ | $d_{33}$ | $g_{33}$ | $Q_m$ | tan $\delta_E$ (%) | Tc (°C.) | |
| 1-1 | 0.11 | 0 | 0.05 | 0.51 | 67.8 | 3165 | 19.8 | 505 | 18.0 | 81 | 1.54 | 209 | good |
| 1-2 | 0.12 | 0 | 0.05 | 0.52 | 75.8 | 4391 | 22.6 | 711 | 18.3 | 62 | 1.82 | 180 | good |
| 1-3 | 0.14 | 0 | 0.05 | 0.54 | 76.5 | 5214 | 23.9 | 804 | 17.4 | 40 | 2.64 | 150 | good |
| 1-4 | 0.06 | 0 | 0.07 | 0.48 | 68.7 | 3047 | 19.3 | 496 | 18.4 | 78 | 2.63 | 232 | good |
| 1-5 | 0.06 | 0.02 | 0.07 | 0.48 | 70.2 | 3226 | 18.9 | 516 | 18.1 | 71 | 1.68 | 213 | good |
| 1-6 | 0.08 | 0.02 | 0.07 | 0.49 | 73.2 | 3530 | 22.5 | 613 | 19.6 | 69 | 2.38 | 190 | good |
| 1-7 | 0.10 | 0 | 0.07 | 0.49 | 74.6 | 4118 | 21.1 | 653 | 17.9 | 69 | 1.69 | 184 | good |
| 1-8 | 0.10 | 0.02 | 0.07 | 0.50 | 75.6 | 4343 | 23.2 | 714 | 18.6 | 41 | 2.63 | 162 | good |
| 1-9 | 0.04 | 0 | 0.08 | 0.47 | 69.5 | 2426 | 20.3 | 459 | 21.4 | 75 | 1.73 | 247 | good |
| 1-10 | 0.04 | 0.02 | 0.08 | 0.47 | 71.7 | 2978 | 20.5 | 527 | 20.0 | 79 | 1.57 | 231 | good |
| 1-11 | 0.04 | 0.04 | 0.08 | 0.47 | 72.7 | 3266 | 21.1 | 568 | 19.7 | 68 | 1.76 | 211 | good |
| 1-12 | 0.08 | 0 | 0.08 | 0.49 | 75.4 | 2523 | 22.7 | 536 | 24.0 | 66 | 1.84 | 206 | good |
| 1-13 | 0.04 | 0 | 0.09 | 0.46 | 70.7 | 2733 | 19.8 | 489 | 20.2 | 94 | 1.41 | 232 | good |
| 1-14 | 0.04 | 0.02 | 0.09 | 0.46 | 71.8 | 3376 | 19.4 | 543 | 18.2 | 65 | 1.73 | 215 | good |
| 1-15 | 0.04 | 0.04 | 0.09 | 0.46 | 73.5 | 3427 | 20.3 | 576 | 19.0 | 79 | 1.53 | 200 | good |
| 1-16 | 0.06 | 0 | 0.09 | 0.47 | 76.0 | 2878 | 22.7 | 578 | 22.7 | 70 | 1.67 | 207 | good |
| 1-17 | 0.06 | 0.02 | 0.09 | 0.47 | 77.0 | 3417 | 23.1 | 643 | 21.3 | 56 | 2.05 | 191 | good |
| 1-18 | 0.08 | 0.02 | 0.09 | 0.47 | 70.0 | 4501 | 19.8 | 625 | 16.2 | 47 | 1.96 | 170 | good |

Samples marked with * lie outside the scope of the invention.

TABLE 2

| Sample No. | Composition | | | | Piezo-electric properties | | | | | | | | Durability |
|---|---|---|---|---|---|---|---|---|---|---|---|---|---|
| | x | y | a | b | $K_{33}$ (%) | $\epsilon_{33}^T / \epsilon_0$ | $S_{33}^E$ | $d_{33}$ | $g_{33}$ | $Q_m$ | tan $\delta_E$ (%) | Tc (°C.) | |
| 1-19 | 0 | 0.09 | 0.09 | 0.46 | 72.5 | 3584 | 24.3 | 636 | 20.1 | 50 | 2.21 | 200 | good |
| 1-20 | 0 | 0.08 | 0.10 | 0.45 | 76.2 | 3314 | 24.5 | 643 | 21.9 | 51 | 2.25 | 200 | good |
| 1-21 | 0 | 0.10 | 0.10 | 0.45 | 74.3 | 4368 | 20.6 | 661 | 17.1 | 44 | 2.62 | 184 | good |
| 1-22 | 0 | 0.12 | 0.10 | 0.45 | 72.0 | 4510 | 20.2 | 646 | 16.2 | 37 | 3.24 | 170 | good |
| 1-23 | 0.04 | 0 | 0.10 | 0.45 | 72.5 | 3033 | 20.0 | 530 | 19.7 | 86 | 1.44 | 215 | good |
| 1-24 | 0.04 | 0.02 | 0.10 | 0.45 | 73.1 | 3500 | 20.0 | 574 | 18.5 | 77 | 1.56 | 209 | good |
| 1-25 | 0.04 | 0.04 | 0.10 | 0.45 | 73.5 | 3821 | 20.1 | 606 | 17.9 | 58 | 2.03 | 201 | good |
| 1-26 | 0.14 | 0 | 0.02 | 0.57 | 72.2 | 1681 | 21.2 | 435 | 27.2 | 185 | 1.31 | 191 | good |
| 1-27 | 0.14 | 0 | 0.01 | 0.58 | 72.0 | 1405 | 20.5 | 405 | 29.2 | 220 | 1.58 | 203 | good |
| 1-*28 | 0.16 | 0 | 0.05 | 0.55 | 75.8 | 5624 | 24.5 | 837 | 16.8 | 32 | 4.83 | 83 | bad |
| 1-*29 | 0 | 0.16 | 0.10 | 0.45 | 68.2 | 4750 | 20.0 | 625 | 14.9 | 29 | 6.54 | 138 | bad |
| 1-*30 | 0.14 | 0 | 0 | 0.58 | 68.5 | 1350 | 18.7 | 324 | 27.1 | 350 | 2.54 | 217 | bad |
| 1-*31 | 0 | 0.14 | 0.14 | 0.49 | 64.3 | 5873 | 16.3 | 592 | 11.4 | 30 | 8.20 | 104 | bad |
| 1-*32 | — | — | — | — | 67.0 | 5450 | 18.5 | 633 | 13.1 | 75 | 2.50 | 140 | bad |
| 1-33 | 0 | 0.14 | 0.10 | 0.45 | 71.5 | 4750 | 20.1 | 657 | 16.0 | 35 | 3.80 | 154 | good |
| 1-*34 | 0 | 0.10 | 0.10 | 0.40 | 46.6 | 1636 | 15.3 | 219 | 15.2 | 122 | 1.35 | 209 | bad |
| 1-*35 | 0 | 0.10 | 0.10 | 0.60 | 28.5 | 2222 | 16.8 | 164 | 8.3 | 73 | 4.70 | 138 | bad |
| 1-36 | 0 | 0.08 | 0.12 | 0.47 | 72.8 | 4520 | 21.0 | 667 | 16.7 | 45 | 2.50 | 155 | good |

Samples marked with * lie outside the scope of the invention

In these Tables 1 and 2, the unit of compliance constant $s_{33}^E$ is x $10^{-12}$ m$^2$/N, the unit of piezo-electric strain constant $d_{33}$ is x $10^{-12}$ m/V, the unit of piezo-electric output constant $g_{33}$ is x $10^{-12}$ Vm/N, and the piezo-electric strain constant $d_{33}$ and the piezo-electric output constant $g_{33}$ are obtained in accordance with $d_{33}=K_{33}(\epsilon_{33}^T \cdot s_{33}^E)^{1/2}$ and $g_{33}= d_{33}/\epsilon_{33}^T$.

Figure 1:
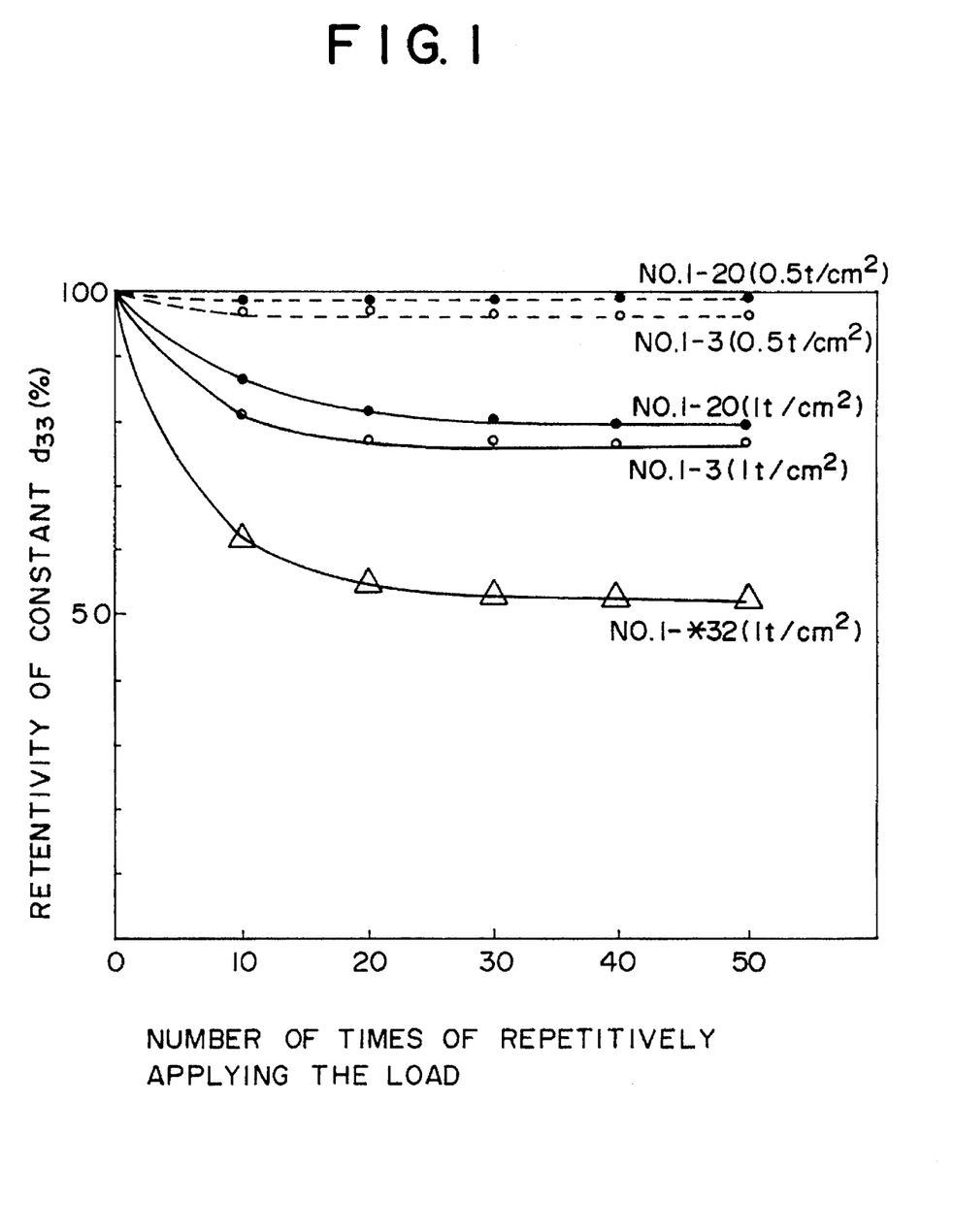
FIG. 1 is a graph illustrating relationships between the retentivity of piezo-electric strain constant and the number of times of repetitively applying the load using the piezo-electric ceramic composition according to the first aspect of the present invention and the piezo-electric ceramic compositions that lie outside the scope of the present invention.

Samples Nos. 1–3, 1–20 and 1–32 of Table 1 were evaluated for their road durability as shown in FIG. 1.

When the temperature environment in which the piezo-electric actuator is used is 100° C. or lower, the Curie temperature must be 150° C. In many cases, the piezo-electric actuator is used in such an environment and 150° C. is the lower limit of the Curie temperature. According to Tables 1 and 2, however, the sample No. 1–3 has a piezo-electric strain constant $d_{33}$ of as large as 804×10$^{-12}$ m/v which is greater than any other samples yet maintaining a Curie temperature of as relatively high as 150° C. The sample No. 1–3 was also tested for its road durability by repetitively applying a pressure of 0.5 ton/cm$^2$ 50 times. As a result, the constant $d_{33}$ attenuation was 5% exhibiting excellent road durability. When the piezo-electric actuator is used in an environment where it is subjected to a temperature of as high as from 100° to 150° C., the Curie temperature must not be lower than 200° C. It is desired that the actuator material has a constant $d_{33}$ which is as large as possible from the standpoint of its function. Samples Nos. 1–19, 1–20 and 1–25 have Curie temperatures of not lower than 200° C. and large piezo-electric strain constants $d_{33}$ which are not smaller than 600×10$^{-12}$ m/v. The samples were also tested for their road durability by repetitively applying a pressure of 0.5 ton/cm$^2$ 50 times. As a result, the constant $d_{33}$ attenuation was 3% lending themselves well for being used as piezo-electric actuator materials.

When the solid-dissolving amount a of $Pb(Zn_{1/3}Sb_{2/3})O_3$ is smaller than 0.05 as in samples Nos. 1–26 and 1–27, a large piezo-output constant $g_{33}$ is obtained though the piezo-electric strain constant $d_{33}$ is not so large. In this case, the material is best suited for use as a piezo-electric sensor such as acceleration sensor.

As described above, the present invention makes it possible to obtain a large piezo-electric strain constant $d_{33}$ and a high Curie temperature as well as very excellent properties in that the attenuation factor of piezo-electric strain constant $d_{33}$ is very small even when the load is applied repetitively. Moreover, a large piezo-electric output constant is obtained.

EXAMPLE 2

Starting powders of PbO, $ZrO_2$, $TiO_2$, $SrCO_3$, $BaCO_3$, ZnO, $Sb_2O_3$, NiO and $TeO_2$ were weighed at ratios shown in Table 3, and were wet-mixed using a ball mill for 24 hours. The mixture was then dehydrated and dried, and was then calcined at 870° C. for 3 hours. The calcined product was wet-pulverized again using the ball mill for 24 hours.

The pulverized product was then blended with an organic binder (PVA) and was granulated. By using the thus obtained powder, two kinds of molded articles were prepared under a pressure of 1.5 ton/cm², i.e., a disk having a diameter of 23 mm and a thickness of 3 mm and a cylinder having a diameter of 8 mm and a thickness of 18 mm. These articles were then fired under a condition of 1270° C. for 3 hours.

The obtained sintered products were polished and machined into a disk having a diameter of 20 mm and a thickness of 1 mm and a cylinder having a diameter of 6 mm and a thickness of 15 mm. Silver electrodes were attached by baking to their both surfaces, and polarization treatment was carried out in a silicone oil heated at 80° C. by applying a DC voltage of not lower than 1.5 KV/mm.

The disk and the cylinder subjected to the polarization treatment were aged at a constant temperature of 120° C. for one hour, and were left to stand for 24 hours. The thus obtained ceramics were examined for their piezo-electric constants (electro-mechanical coupling coefficient $K_{33}$, dielectric constant $\epsilon_{33}^T/\epsilon_0$, compliance constant $s_{33}^E$, piezo-electric strain constant $d_{33}$, dielectric loss tan $\delta_E$) in accordance with the measuring method standardized by the Japanese Association of Electronic Material Industries (EMAS). The Curie temperature Tc was that of when a maximum value in the dielectric constant was exhibited at the time when the phase was shifting from a normal dielectric phase on the high-temperature side into a ferro-electric phase on the low-temperature side. Road durability was found by repetitively applying a pressure of 1 ton/cm² onto the cylindrical ceramics at an interval of a cycle of 4 seconds by using a mono-axial hydraulic press machine and by measuring the retentivity of piezo-electric strain constant $d_{33}$. The ceramics that exhibited the attenuation factor of piezo-electric strain constant $d_{33}$ of not larger than 20% after the pressure was repetitively applied 10 times were regarded to be good ones, and the ceramics that exhibited the attenuation factor of larger than 20% were regarded to be bad ones.

Furthermore, displacement that occurred in the direction of polarization when a voltage of 100 V was applied to the disk-like sample was measured by using a non-contact type optical sensor in order to measure displacement hysteresis. Here, the displacement hysteresis was expressed as a ratio of a difference between a half-maximum voltage (50 V) that is rising and a half-maximum voltage (50 v) that is lowering to the displacement of when a maximum voltage (100 V) is applied. The samples that exhibited displacement hysteresis of larger than 10% were regarded to be bad ones, the samples that exhibited displacement hysteresis of 10 to 7% were regarded to be fairly good ones, and the samples that exhibited displacement hysteresis of smaller than 7% were regarded to be good ones. The results were as shown in Table 3.

TABLE 3

| Sample No. | Compositon | | | | | Piezo-electric properties | | | | | | | Displacement hysteresis | Durability |
|---|---|---|---|---|---|---|---|---|---|---|---|---|---|---|
| | x | y | a | b | c | $K_{33}$ (%) | $\epsilon_{33}^T/\epsilon_0$ | $s_{33}^E$ | $d_{33}$ | $g_{33}$ | tan $\delta_B$ (%) | Tc (°C.) | | |
| 2-R-1 | 0.12 | 0 | 0.05 | 0.52 | 0 | 75.8 | 4391 | 22.6 | 710 | 18.3 | 1.82 | 177 | bad | good |
| 2-2 | 0.12 | 0 | 0.05 | 0.52 | 0.002 | 75.4 | 4480 | 22.7 | 715 | 18.0 | 1.75 | 177 | good | good |
| 2-3 | 0.12 | 0 | 0.05 | 0.52 | 0.005 | 74.5 | 4726 | 22.7 | 725 | 17.3 | 1.74 | 177 | good | good |
| 2-4 | 0.12 | 0 | 0.05 | 0.52 | 0.010 | 73.8 | 3368 | 23.4 | 616 | 20.7 | 1.89 | 173 | good | good |
| 2-5 | 0.12 | 0 | 0.05 | 0.51 | 0.020 | 68.8 | 3327 | 21.2 | 544 | 18.5 | 2.08 | 170 | good | good |
| 2-6 | 0 | 0.08 | 0.10 | 0.45 | 0.005 | 75.7 | 3772 | 22.7 | 659 | 19.7 | 2.12 | 200 | good | good |
| 2-7 | 0 | 0.08 | 0.10 | 0.44 | 0.010 | 74.2 | 3511 | 21.8 | 611 | 19.7 | 1.86 | 200 | good | good |
| 2-8 | 0 | 0.08 | 0.10 | 0.43 | 0.020 | 64.5 | 2350 | 19.0 | 405 | 19.5 | 1.50 | 182 | good | good |
| 2-*9 | 0 | 0.08 | 0.10 | 0.43 | 0.021 | 60.0 | 2200 | 18.9 | 364 | 18.7 | 1.50 | 180 | fair | good |
| 2-10 | 0.04 | 0.02 | 0.08 | 0.47 | 0.005 | 72.8 | 3170 | 22.1 | 572 | 20.3 | 1.44 | 230 | good | good |
| 2-*11 | 0.16 | 0 | 0.05 | 0.55 | 0 | 75.8 | 5624 | 24.5 | 837 | 16.8 | 4.83 | 83 | bad | bad |
| 2-*12 | 0 | 0.16 | 0.10 | 0.45 | 0 | 68.2 | 4750 | 20.0 | 625 | 14.9 | 6.54 | 138 | bad | bad |
| 2-13 | 0.04 | 0.05 | 0.10 | 0.45 | 0.005 | 74.5 | 3950 | 20.3 | 628 | 18.0 | 1.80 | 200 | good | good |
| 2-R-14 | 0 | 0.14 | 0.10 | 0.45 | 0 | 70.5 | 4700 | 20.1 | 657 | 16.0 | 3.80 | 154 | bad | good |
| 2-15 | 0 | 0.14 | 0.10 | 0.45 | 0.005 | 71.2 | 4870 | 21.2 | 681 | 15.8 | 3.25 | 175 | good | good |
| 2-16 | 0 | 0.08 | 0.12 | 0.47 | 0.005 | 57.7 | 4725 | 20.1 | 614 | 15.0 | 2.10 | 170 | good | good |
| 2-R-17 | 0.14 | 0 | 0.01 | 0.58 | 0 | 72.0 | 1405 | 20.5 | 405 | 29.2 | 1.58 | 203 | bad | good |
| 2-18 | 0.14 | 0 | 0.01 | 0.58 | 0.005 | 73.5 | 1502 | 20.3 | 400 | 28.7 | 1.35 | 203 | good | good |
| 2-*19 | — | — | — | — | — | 65.5 | 5500 | 18.4 | 620 | 12.7 | 2.55 | 140 | bad | bad |

TABLE 3-continued

| Sample | Compositon | | | | | Piezo-electric properties | | | | | | | Displacement | Dura- |
| | | | | | | $K_{33}$ | $\epsilon_{33}^T$ | | | | tan $\delta_E$ | Tc | ment | |
| No. | x | y | a | b | c | (%) | /$\epsilon_0$ | $s_{33}^E$ | $d_{33}$ | $g_{33}$ | (%) | (°C.) | hysteresis | bility |
| --- | --- | --- | --- | --- | --- | --- | --- | --- | --- | --- | --- | --- | --- | --- |
| 2-*20 | 0.04 | 0 | 0.14 | 0.42 | 0 | 70.5 | 3540 | 21.5 | 579 | 18.5 | 1.75 | 163 | bad | good |
| 2-*21 | 0.14 | 0 | 0 | 0.58 | 0 | 65.5 | 1360 | 18.5 | 309 | 25.7 | 2.54 | 217 | bad | bad |
| 2-*22 | 0 | 0.10 | 0.10 | 0.60 | 0 | 28.0 | 2230 | 16.5 | 160 | 8.1 | 5.10 | 138 | bad | bad |

Samples marked with * lie outside the scope of the invention.
2-R-1, 2-R-14 and 2-R-17 are Reference Examples.

In Table 3, the unit of compliance constant $s_{33}^E$ is x $10^{-12}$ m²/N, the unit of piezo-electric strain constant $d_{33}$ is x $10^{-12}$ m/V, the unit of piezo-electric output constant $g_{33}$ is x $10^{-12}$ Vm/N, and the piezo-electric strain constant $d_{33}$ and the piezo-electric output constant $g_{33}$ are obtained in accordance with $d_{33}=K_{33}(\epsilon_{33}^T \cdot s_{33}^E)^{1/2}$ and $g_{33}=d_{33}/\epsilon_{33}^T$.

Figure 2:
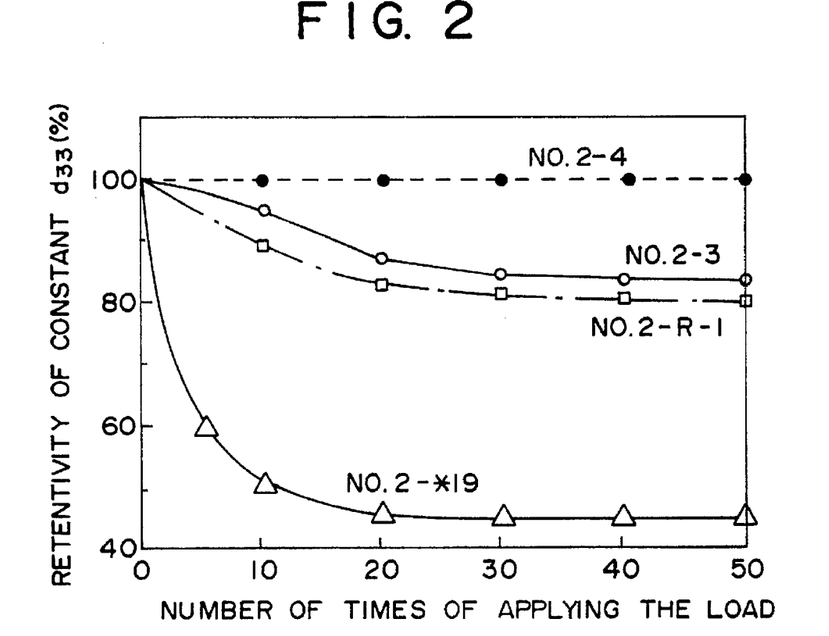
FIG. 2 is a graph illustrating relationships between the retentivity of piezo-electric strain constant and the number of times of repetitively applying the load using the piezo-electric ceramic composition according to the second aspect of the present invention and the piezo-electric ceramic compositions that lie outside the scope of the present invention.
Figure 3:
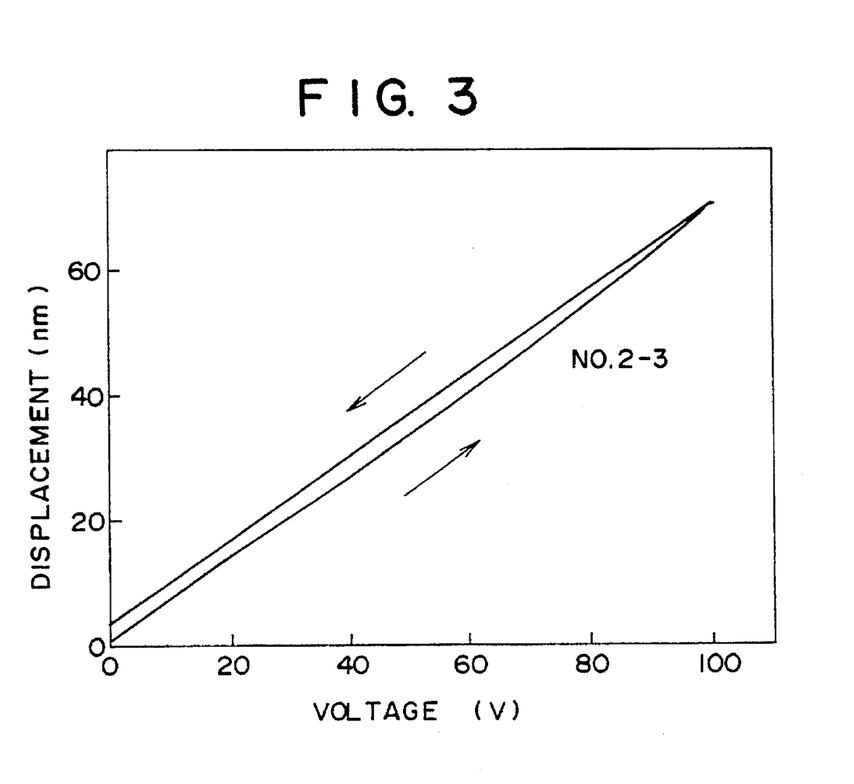
FIG. 3 is a graph illustrating a relationship between the applied voltage and the displacement using the piezo-electric ceramic composition according to the second aspect of the present invention.
Figure 4:
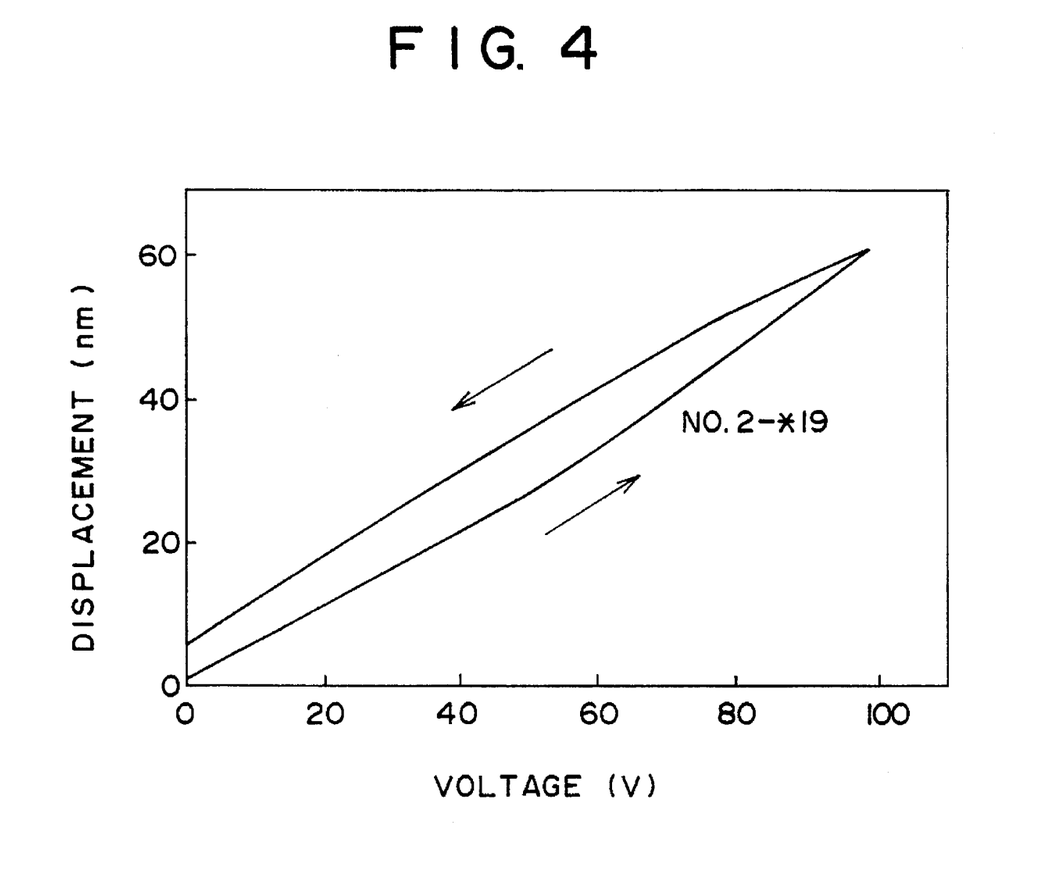
FIG. 4 is a graph illustrating a relationship between the applied voltage and the displacement using a piezo-electric ceramic composition that lies outside the scope of the present invention.

Samples Nos. 2-3, 2-4 and 2-19 of Table 3 were evaluated for their road durability as shown in FIG. 2.

When the temperature environment in which the piezoelectric actuator is used is 100° C. or lower, the Curie temperature must be 150° C. In many cases, the piezoelectric actuator is used in such an environment and the lower limit of the Curie temperature must be not lower than 150° C. According to Table 3, however, the sample No. 2-3 has a piezo-electric strain constant $d_{33}$ of as large as 725× $10^{-12}$ m/v which is greater than any other samples yet maintaining a Curie temperature of as high as 177° C. The sample No. 2-3 was also tested for its road durability by repetitively applying a pressure of 0.5 ton/cm² 50 times. As a result, the constant $d_{33}$ attenuation was 2% exhibiting excellent road durability.

Furthermore, excellent displacement characteristics were exhibited upon the application of voltage, e.g., displacement hysteresis of 5.4% and excellent linearity. When the piezoelectric actuator is used in an environment where it is subjected to a temperature of as high as from 100° to 150° C., the Curie temperature must not be lower than 200° C. It is desired that the actuator material has a constant $d_{33}$ which is as large as possible from the standpoint of its function. Samples Nos. 2-6 and 2-7 have a Curie temperature of 200° C. and large piezo-electric strain constants $d_{33}$ which are larger than 600×$10^{-12}$ m/v. The samples were also tested for their road durability by repetitively applying a pressure of 0.5 ton/cm² 50 times. As a result, the constant $d_{33}$ attenuation was about 2% lending themselves well for being used as piezo-electric actuator materials. Moreover, the displacement hysteresis was not larger than 7% lending themselves well for being used as positioning elements as well.

When the solid-dissolving amount a of Pb(Zn$_{1/3}$Sb$_{2/3}$)O$_3$ is smaller than 0.05 as in sample No. 2-18, a large piezoelectric-output constant $g_{33}$ is obtained though the piezoelectric strain constant $d_{33}$ is not so large. In this case, the material is best suited for use as a piezo-electric sensor such as acceleration sensor. Moreover, since the hysteresis is small accompanying the shift of ferroelectric domain, the output voltage characteristics are linear for the application of stress, and the sample No. 2-18 is very suited for use as a sensor material.

As described above, the present invention makes it possible to obtain a large piezo-electric strain constant $d_{33}$ and a high Curie temperature as well as very excellent properties in that the attenuation factor of piezo-electric strain constant $d_{33}$ is very small even when the load is applied repetitively.

Moreover, excellent properties are exhibited such as very small displacement hysteresis and a large piezo-electric output constant.

EXAMPLE 3

Starting powders of PbO, ZrO$_2$, TiO$_2$, SrCO$_3$, BaCO$_3$, ZnO, Sb$_2$O$_3$, NiO, TeO$_2$ and Nb$_2$O$_5$ were weighed at ratios shown in Tables 1 and 2, and were wet-mixed using a ball mill for 24 hours. The mixture was then dehydrated and dried, and was then calcined at 870° C. for 3 hours. The calcined product was wet-pulverized again using the ball mill for 24 hours.

The pulverized product was then blended with an organic binder (PVA) and was granulated. By using the thus obtained powder, two kinds of molded articles were prepared under a pressure of 1.5 ton/cm², i.e., a disk having a diameter of 23 mm and a thickness of 3 mm and a cylinder having a diameter of 8 mm and a thickness of 18 mm. These articles were then fired under a condition of 1270° C. for 3 hours.

The obtained sintered products were polished and machined into a disk having a diameter of 20 mm and a thickness of 1 mm and a cylinder having a diameter of 6 mm and a thickness of 15 mm. Silver electrodes were attached by baking to their both surfaces, and polarization treatment was carried out in a silicone oil heated at 80° C. by applying a DC voltage of not lower than 1.5 KV/mm.

The disk and the cylinder subjected to the polarization treatment were aged at a constant temperature of 100° C. for one hour, and were left to stand for 24 hours. The thus obtained ceramics were examined for their piezo-electric constants (electro-mechanical coupling coefficient $K_{33}$, dielectric constant $\epsilon_{33}^T/\epsilon_0$, compliance constant $s_{33}^E$, piezoelectric strain constant $d_{33}$, dielectric loss tan $\delta_E$) in accordance with the measuring method standardized by the Japanese Association of Electronic Material Industries (EMAS).

The Curie temperature Tc was that of when a maximum value in the dielectric constant was exhibited at the time when the phase was shifting from a normal dielectric phase on the high-temperature side into a ferro-electric phase on the low-temperature side. The heat durability was found by measuring the cylindrical ceramics for their retentivity of piezo-electric strain constant $d_{33}$ after they were left to stand at constant temperatures of 130° C. and 150° C. The ceramics that exhibited the retentivity of not smaller than 97% were regarded to be good ones, the ceramics that exhibited the retentivity of 96 to 94% were regarded to be fairly good ones, and the ceramics that exhibited the retentivity of not larger than 93% were regarded to be bad ones. Road durability was found by repetitively applying a pressure of 1 ton/cm² onto the cylindrical ceramics at an interval of a cycle of 4 seconds by using a mono-axial hydraulic press machine and by measuring the retentivity of piezo-electric strain constant $d_{33}$. The ceramics that exhibited the retentivity of piezo-electric strain constant $d_{33}$ of not smaller than 80% after the pressure was repetitively applied 10 times were regarded to be good ones, and the ceramics that exhibited the retentivity of smaller than 80% were regarded to be bad ones.

Furthermore, displacement that occurred in the direction of polarization when a voltage of 100 V was applied to the disk-like sample was measured by using a non-contact type optical sensor in order to measure displacement hysteresis. Here, the displacement hysteresis was expressed as a ratio of a difference between a half-maximum voltage (50 V) that is rising and a half-maximum voltage (50 V) that is lowering to the displacement of when a maximum voltage (100 V) is applied. The samples that exhibited displacement hysteresis of larger than 10% were regarded to be bad ones, the samples that exhibited displacement hysteresis of 10 to 7% were regarded to be fairly good ones, and the samples that exhibited displacement hysteresis of smaller than 7% were regarded to be good ones. The displacement upon the application of an electric field that changes depending upon the temperature was found by measuring the displacement in the direction of polarization of when a voltage 100 V/mm was applied to the cylindrical sample by using a TMA device. Here, the change of displacement due to the temperature is the ratio of the displacement at 120° C. to the displacement at 20° C., and the samples exhibiting the change of displacement of larger than 15% were regarded to be bad ones and the samples exhibiting the change of displacement of not larger than 15% were regarded to be good ones. The results were as shown in Tables 4 and 5.

TABLE 4

| Sample No. | Composition Basic components (molar ratio) | | | | | | Piezo-electric properties | | | | | | Heat resistance (°C.) | | Dura-bili-ty | Hys-tere-sis A | Temp. B |
|---|---|---|---|---|---|---|---|---|---|---|---|---|---|---|---|---|---|
| | x | y | a | b | c | g | $K_{33}$ (%) | $\epsilon_{33}^T/\epsilon_0$ | $S_{33}^E$ | $d_{33}$ | tan $\delta_E$ (%) | Tc (°C.) | 150 | 180 | | | |
| 3-R-1 | 0.04 | 0.02 | 0.075 | 0.47 | 0.005 | 0 | 71.4 | 3107 | 21.0 | 544 | 1.36 | 238 | good | good | good | good | good |
| 3-2 | 0.04 | 0.02 | 0.075 | 0.47 | 0.005 | 0.3 | 75.0 | 3265 | 22.0 | 598 | 1.52 | 235 | good | good | good | good | good |
| 3-3 | 0.04 | 0.02 | 0.075 | 0.47 | 0.005 | 0.5 | 75.8 | 3370 | 22.3 | 618 | 1.81 | 232 | good | good | good | good | good |
| 3-4 | 0.04 | 0.02 | 0.075 | 0.47 | 0.005 | 0.7 | 75.5 | 3396 | 21.9 | 613 | 1.79 | 229 | good | good | good | good | good |
| 3-5 | 0.04 | 0.02 | 0.075 | 0.47 | 0.005 | 1.0 | 73.7 | 3405 | 21.2 | 588 | 1.93 | 227 | fair | good | good | fair | good |
| 3-6 | 0.04 | 0.02 | 0.075 | 0.47 | 0.005 | 1.2 | 72.0 | 3502 | 21.0 | 580 | 1.92 | 226 | fair | good | good | fair | good |
| 3-R-7 | 0.04 | 0.02 | 0.075 | 0.47 | 0 | 0 | 71.4 | 2878 | 20.1 | 511 | 1.52 | 234 | good | good | good | bad | good |
| 3-R-8 | 0 | 0.08 | 0.10 | 0.45 | 0.005 | 0 | 75.7 | 3134 | 22.7 | 659 | 2.12 | 200 | fair | good | good | good | bad |
| 3-9 | 0 | 0.08 | 0.10 | 0.45 | 0.005 | 0.3 | 76.1 | 4010 | 23.2 | 691 | 2.42 | 200 | good | good | good | good | good |
| 3-10 | 0 | 0.08 | 0.10 | 0.45 | 0.005 | 0.5 | 75.1 | 4220 | 22.3 | 685 | 2.60 | 198 | good | good | good | good | good |
| 3-11 | 0 | 0.08 | 0.10 | 0.45 | 0.005 | 1.0 | 74.8 | 4084 | 21.6 | 661 | 2.65 | 195 | good | good | good | fair | good |
| 3-12 | 0 | 0.08 | 0.10 | 0.45 | 0.005 | 1.5 | 73.0 | 4253 | 20.6 | 643 | 2.85 | 187 | bad | fair | bad | good | bad |
| 3-13 | 0 | 0.08 | 0.10 | 0.445 | 0.005 | 0.3 | 76.3 | 4577 | 22.8 | 733 | 2.20 | 200 | fair | good | good | good | good |
| 3-14 | 0 | 0.08 | 0.10 | 0.45 | 0.010 | 0.3 | 74.0 | 4210 | 23.5 | 692 | 2.60 | 197 | fair | good | good | fair | good |
| 3-15 | 0 | 0.08 | 0.12 | 0.43 | 0.005 | 0.3 | 57.0 | 5012 | 21.0 | 550 | 2.58 | 182 | good | good | good | fair | good |
| 3-16 | 0.12 | 0 | 0.05 | 0.52 | 0.005 | 0.3 | 74.3 | 4958 | 22.0 | 730 | 2.05 | 175 | good | good | good | fair | good |

3-R-1, 3-R-7, etc. marked with -R are Reference Examples.
Symbol a represents the total amount of PbO and $Nb_2O_5$ per 100 parts by weight of the basic components (unit is part by weight).
Hysteresis A: Displacement hysteresis
Temp. B: Change of displacement due to temperature

TABLE 5

| Sample No. | Composition Basic components (molar ratio) | | | | | | Piezo-electric properties | | | | | | Heat resistance (°C.) | | Dura-bili-ty | Hys-tere-sis A | Temp. B |
|---|---|---|---|---|---|---|---|---|---|---|---|---|---|---|---|---|---|
| | x | y | a | b | c | g | $K_{33}$ (%) | $\epsilon_{33}^T/\epsilon_0$ | $S_{33}^E$ | $d_{33}$ | tan $\delta_E$ (%) | Tc (°C.) | 150 | 180 | | | |
| 3-17 | 0 | 0.12 | 0.10 | 0.45 | 0.005 | 0.3 | 69.5 | 4210 | 21.0 | 615 | 2.85 | 171 | good | good | good | fair | good |
| 3-18 | 0 | 0.08 | 0.10 | 0.45 | 0 | 0.3 | 75.8 | 4516 | 22.1 | 712 | 2.35 | 197 | fair | good | good | fair | good |
| 3-19 | 0 | 0.08 | 0.10 | 0.45 | 0 | 0.5 | 75.0 | 4459 | 21.3 | 689 | 2.60 | 195 | fair | fair | good | fair | good |
| 3-20 | 0 | 0.08 | 0.10 | 0.45 | 0 | 0.7 | 73.6 | 4477 | 20.9 | 671 | 2.63 | 193 | fair | fair | good | fair | good |
| 3-21 | 0 | 0.08 | 0.10 | 0.44 | 0.015 | 0.3 | 67.1 | 3225 | 20.0 | 507 | 2.88 | 194 | fair | fair | good | good | good |
| 3-22 | 0.04 | 0.02 | 0.075 | 0.47 | 0.005 | 0.2 | 74.0 | 3200 | 22.0 | 584 | 1.50 | 236 | good | good | good | good | good |
| 3-*23 | — | — | — | — | — | — | 65.5 | 5500 | 18.4 | 620 | 2.55 | 140 | bad | bad | bad | bad | bad |
| 3-24 | 0.10 | 0 | 0.05 | 0.51 | 0 | 0.5 | 73.5 | 3560 | 21.5 | 605 | 1.75 | 203 | fair | good | good | good | good |

Samples marked with * lie outside the scope of the invention.
Symbol a represents the total amount of PbO and $Nb_2O_5$ per 100 parts by weight of the basic components (unit is part by weight).
Hysteresis A: Displacement hysteresis
Temp. B: Change of displacement due to temperature In Tables 4 and 5, the unit of compliance constant $s_{33}^E$ is $\times 10^{-12}$ m$^2$/N, the unit of piezo-electric strain constant $d_{33}$ is $\times 10^{-12}$ m/V and is obtained in accordance with $d_{33} = K_{33} (\epsilon_{33}^T \cdot s_{33}^E)^{1/2}$. In Tables, symbol a represents the total amount of PbO and Nb$_2$O$_5$ which are contained at an equal molar ratio per 100 parts by weight of the basic components.

Figure 5:
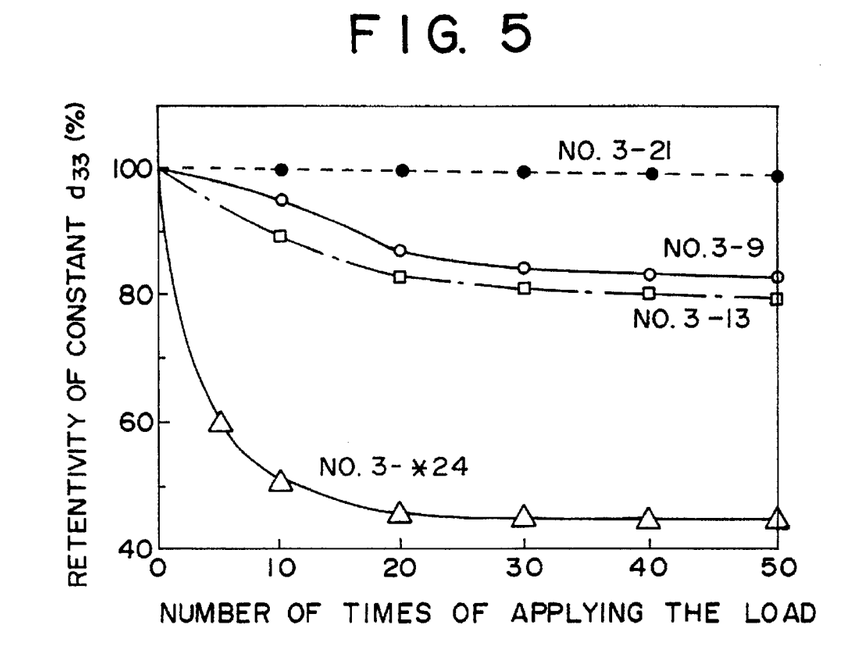
FIG. 5 is a graph illustrating relationships between the retentivity of piezo-electric strain constant and the number of times of repetitively applying the load using the piezo-electric ceramic composition according to the third aspect of the present invention and the piezo-electric ceramic compositions that lie outside the scope of the present invention.
Figure 6:
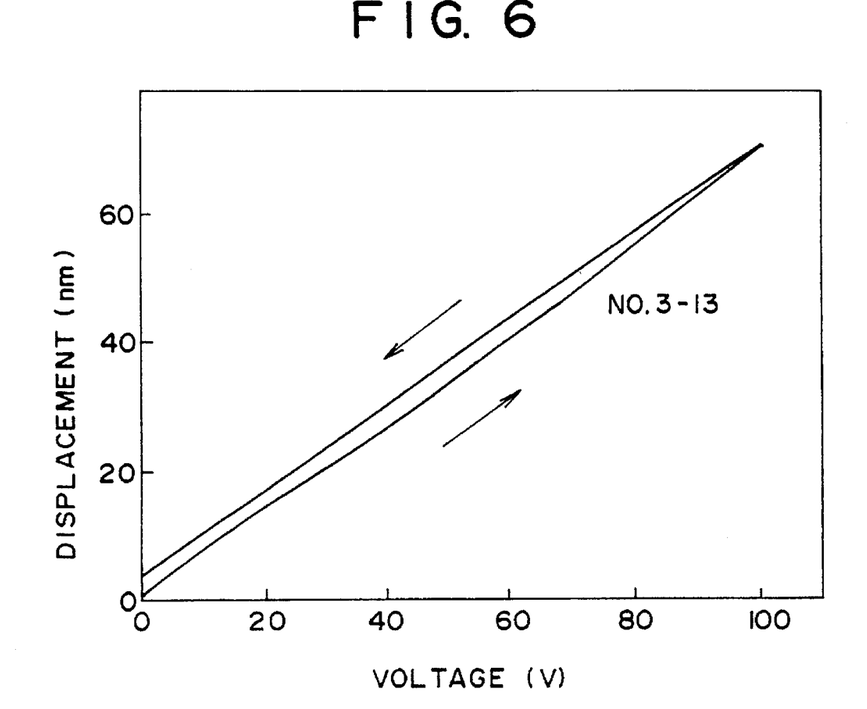
FIG. 6 is a graph illustrating a relationship between the applied voltage and the displacement using the piezo-electric ceramic composition according to the third aspect of the present invention.
Figure 7:
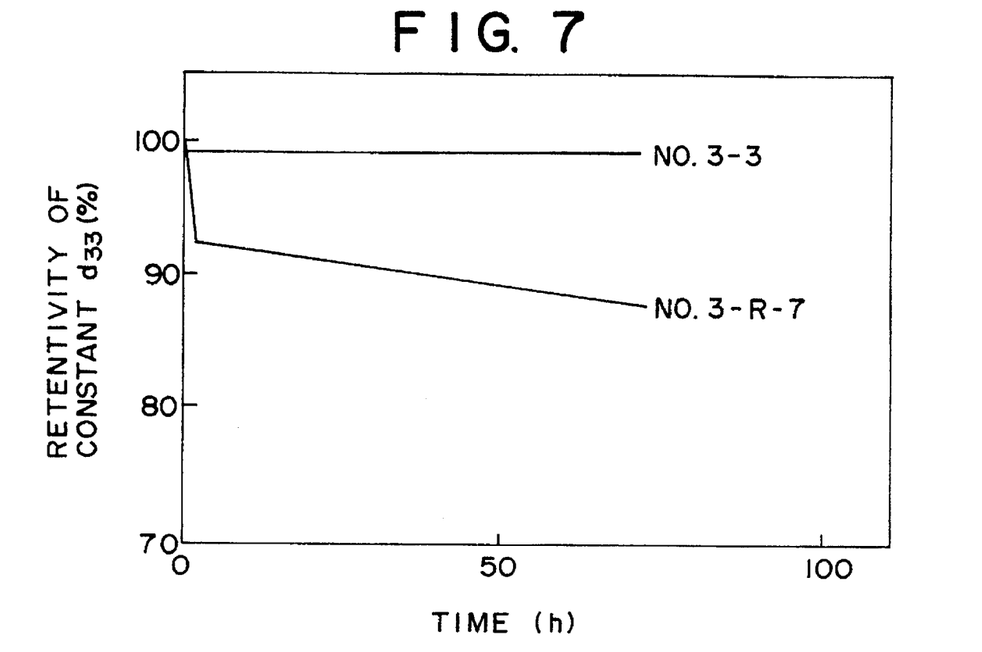
FIG. 7 is a graph illustrating relationships between the retentivity of piezo-electric strain constant and the time of the piezo-electric ceramic composition according to the third aspect of the present invention and a piezoelectric ceramic composition that lies outside the scope of the present invention at a constant temperature maintained at 150° C.
Figure 8:
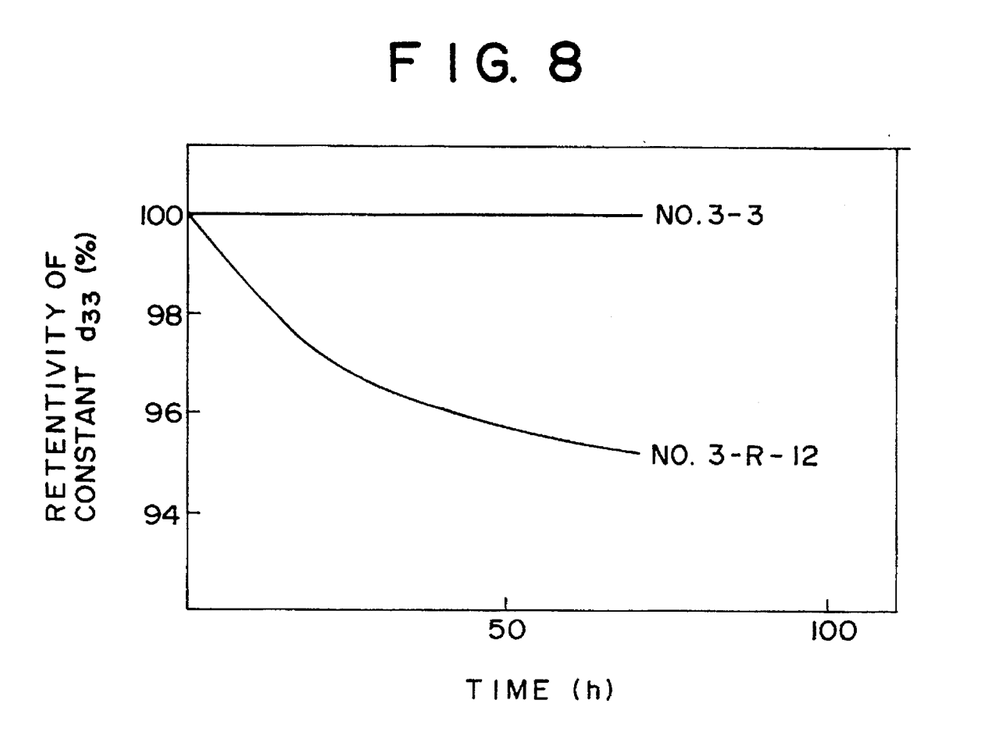
FIG. 8 is a graph illustrating a relationship similar to that of FIG. 7 as measured at a constant temperature maintained at 130° C.

Samples Nos. 3-9, 3-13, 3-21 and 3-23 of Tables 4 and 5 were evaluated for their road durability as shown in FIG. 5.

When the temperature environment in which the piezo-electric actuator is used is 100° C. or lower, the Curie temperature must be 170° C. In many cases, the piezo-electric actuator is used in such an environment and the lower limit of the Curie temperature must not be lower than 170° C. According to Table 4, however, the sample No. 3-13 has a piezo-electric strain constant $d_{33}$ of as large as 733× $10^{-12}$ m/v which is greater than any other samples yet maintaining a Curie temperature of as high as 200° C. The sample No. 3-13 was also tested for its road durability by repetitively applying a pressure of 0.5 ton/cm$^2$ 50 times. As a result, the constant $d_{33}$ attenuation was 20% exhibiting excellent road durability.

Furthermore, excellent displacement characteristics were exhibited upon the application of voltage, e.g., displacement hysteresis of 5.8% and excellent linearity. When the piezo-electric actuator is used in an environment where it is subjected to a temperature of as high as from 100° to 150° C., the Curie temperature must not be lower than 200° C. It is desired that the actuator material has a constant $d_{33}$ which is as large as possible from the standpoint of its function. The sample No. 3-3 has a Curie temperature of 232° C. and a piezo-electric strain constant $d_{33}$ which is as large as 618×10$^{-12}$ m/v. Even in the heat durability testing in which the sample was left to stand at a constant temperature of 150° C. for 70 hours, the sample No. 3-3 exhibited the retentivity of $d_{33}$ of not smaller than 99%. The samples were further tested for their road durability by repetitively applying a pressure of 0.5 ton/cm$^2$ 50 times. As a result, the samples exhibited the retentivity of constant $d_{33}$ of about 98% and were suited for being used as piezo-electric actuator materials. Moreover, the displacement hysteresis was not larger than 7% lending themselves well for being used as positioning elements as well.

As described above, the piezo-electric ceramic composition of the present invention makes it possible to obtain a large piezo-electric strain constant $d_{33}$ and a high Curie temperature and, besides, exhibiting a very small attenuation factor of piezo-electric strain constant $d_{33}$ even after the load is repetitively added thereto. The piezo-electric ceramic composition of the present invention further exhibits excellent properties such as excellent heat durability, very small displacement hysteresis, and displacement upon the application of voltage that changes little depending upon the temperature.

The present invention makes it possible to obtain an actuator by using the piezo-electric ceramic composition of the invention in the form of a single plate or laminated plates.

A large displacement can be obtained by using the piezo-electric ceramic composition in the form of laminated plates.

We claim:

1. A piezo-electric ceramic composition of a composite perovskite compound containing, as metal components, Pb, Zr, Ti, Zn, Sb, Sr, Ba and optionally Ni and Te, wherein the composition is expressed as:

$$Pb_{1-x-y}Sr_xBa_y(Zn_{1/3}Sb_{2/3})_aZr_b(Ni_{1/2}Te_{1/2})_cTi_{1-a-b-c}O_3$$

and wherein x, y, a, b and c satisfy the following relationships:

0.04≦x≦0.12

0.02≦y≦0.12

0.01≦a≦0.12

0.43≦b≦0.58

0≦c≦0.02.

2. The piezo-electric ceramic composition according to claim 1, wherein the piezo-electric ceramic composition is a composite perovskite compound containing, as metal components, Pb, Zr, Ti, Zn, Sb, Sr and Ba, wherein the composition is expressed as:

$$Pb_{1-x-y}Sr_xBa_y(Zn_{1/3}Sb_{2/3})_aZr_bTi_{1-a-b}O_3,$$

and wherein x, y, a and b satisfy the following relationships:

0.04≦x≦0.12

0.02≦y≦0.12

0.01≦a≦0.12

0.43≦b≦0.58.

3. The piezo-electric ceramic composition according to claim 2, wherein a lies within a range of 0.05≦a≦0.12.

4. The piezo-electric ceramic composition according to claim 2, wherein a lies within a range of 0.01≦a≦0.05.

5. A piezo-electric ceramic composition of a composite perovskite compound containing, as metal components, Pb, Zr, Ti, Zn, Sb, Ni, Te and at least one metal selected from Sr and Ba, wherein the composition is expressed as:

$$Pb_{1-x-y}Sr_xBa_y(Zn_{1/3}Sb_{2/3})_aZr_b(Ni_{1/2}Te_{1/2})_cTi_{1-a-b-c}O_3$$

and wherein x, y, a, b and c satisfy the following relationships:

0≦x≦0.14

0≦y≦0.14

0≦x+y 0.01≦a≦0.12

0.43≦b≦0.58

0.002≦c≦0.020.

6. The piezo-electric ceramic composition of claim 5, wherein x, y, a, b and c satisfy the following relationships:

0.04≦x≦0.12

0.02≦y≦0.12

0.05≦a≦0.10

0.43≦b≦0.58

0.002≦c≦0.007.

7. A piezo-electric ceramic composition of a composite perovskite compound containing, as metal components, Pb, Zr, Ti, Zn, Sb, and at least one metal selected from Sr and Ba, and optionally Ni and Te, wherein the composition is expressed as:

$$Pb_{1-x-y}Sr_xBa_y(Zn_{1/3}Sb_{2/3})_aZr_b(Ni_{1/2}Te_{1/2})_cTi_{1-a-b-c}O_3$$

and wherein x, y, a, b and c satisfy the following relationships:

0≦x≦0.12

0≦y≦0.12

0≦x+y $0.05 \leq a \leq 0.12$ $0.43 \leq b \leq 0.52$ $0 \leq c \leq 0.015$ and further comprising PbO and $Nb_2O_5$ of an equal molar ratio added in a total amount of from 0.2 to 1.2 parts by weight per 100 parts by weight of the above-mentioned base components.

8. The piezo-electric ceramic composition of claim 7, wherein x, y, a, b and c in the molar ratio composition formula satisfy the following relationships:

$0.04 \leq x \leq 0.10$ $0.02 \leq y \leq 0.12$ $0.07 \leq a \leq 0.10$ $0.43 \leq b \leq 0.52$ $0.002 \leq c \leq 0.007$ and further comprising PbO and $Nb_2O_5$ of an equal molar ratio added in a total amount of from 0.3 to 0.7 parts by weight per 100 parts by weight of the basic components.

* * * * *